United States Patent [19]

Haigh et al.

[11] 4,260,968

[45] Apr. 7, 1981

[54] ACTIVE FILTER NETWORK UTILIZING POSITIVE IMPEDANCE CONVERTERS

[75] Inventors: David G. Haigh, Walton-on-Thames; Wolja Saraga, Orpington, both of England

[73] Assignee: National Research Development Corporation, London, England

[21] Appl. No.: 20,587

[22] Filed: Mar. 14, 1979

[30] Foreign Application Priority Data

Mar. 14, 1978 [GB] United Kingdom ............... 10143/78

[51] Int. Cl.³ ............................................ H03H 11/04
[52] U.S. Cl. .................................... 333/214; 307/520
[58] Field of Search ................. 330/107; 333/213–215; 307/295

[56] References Cited

U.S. PATENT DOCUMENTS 3,599,008  8/1971  Gorski-Popiel ................. 333/214 X
3,750,037  7/1973  Schmidt ........................... 333/215 X Primary Examiner—Paul L. Gensler
Attorney, Agent, or Firm—Pollock, VandeSande and Priddy

[57] ABSTRACT

A band-pass filter consists of a number of circuits resistively coupled together to form a ladder network between an input and an output. Each circuit includes a positive impedance converter terminated so as to provide an impedance inversely proportional to the square of the complex frequency, preferably a capacitatively-terminated positive impedance converter is used wherein the impedance conversion ratio is proportional to the complex frequency. The input and output of the filter are resistively terminated such that all reactive elements of the filter are contained within the said circuits. Preferably the capacitors all have the same capacitance value.

4 Claims, 7 Drawing Figures

ACTIVE FILTER NETWORK UTILIZING POSITIVE IMPEDANCE CONVERTERS

The invention relates to active inductorless band-pass filters which employ resistors, capacitors and active units for use in signal processing. The active units, referred to as positive impedance converters, consist of resistors and capacitors and commonly employ "operational amplifiers". The term "operational amplifier" as hereinafter used defines a substantially linear differential input amplifier preferably having a high gain at the frequencies of operation.

Active-RC band-pass filters are attractive because by appropriate design it is possible to achieve filters of substantially the same low sensitivity as corresponding LCR filters and having very much reduced volume and weight. One method leading to low sensitivity is by simulation of prototype LCR band-pass filters. A particular method involves simulation of the structure and elements of the prototype filter. This can be done with or without frequency-dependent impedance scaling.

An impedance converter is a three-terminal two-port active device capable of converting a given impedance into some other impedance. The first port consists of the first and third terminals of the device and the second port consists of the second terminal and the common third terminal. A Positive Impedance Converter (PIC) may be of a type known as a p-type PIC where the impedance conversion ratio is proportional to p, where p is the complex frequency variable, or of a type known as a $p^2$-type PIC where the impedance conversion ratio is proportional to $P^2$. Interchange of the first and second ports of the device gives conversion ratios proportional to $1/p$ and $1/p^2$ respectively.

In the manufacture of filter networks by micro-electronic techniques, filter design problems must be considered in relation to the manufacturing process adopted. In one such process the active filter networks are realized as hybrid modules using a substrate on which are deposited thin or thick film conductor and resistor patterns to which are connected operational amplifiers in the form of single-chip integrated circuits. Such operational amplifiers are readily available commercially and thin or thick film resistors can be adjusted with great accuracy by a number of techniques, making these elements desirable for adoption in the micro-electronic process. Thin film capacitors, however, such as tantalum or silicon dioxide suffer a number of disadvantages which make them less attractive than ceramic chip capacitors. Ceramic chip capacitors have high Q factors and low temperature coefficients, and they are hermetically sealed and rugged, making them desirable for high grade filter fabrication. Such capacitors are relatively cheap if manufacturers' preferred nominal capacitance values and wide manufacturing tolerances are used. Ceramic chip capacitors however, are very small and usually unmarked and therefore have to be handled carefully to avoid errors during assembly into the micro-electronic circuits. This problem would be eased if it were possible for all capacitors to have the same nominal capacitance.

Hitherto, precision active band-pass filters have not been able to simultaneously achieve all the following properties:
(a) all capacitors having the same nominal value,
(b) the nominal value being a manufacturers' preferred value
(c) the capacitance having wide (eg ±10%) manufacturing tolerances, and
(d) the total number of capacitors being the theoretical minimum.

The object of the invention is to provide a low sensitivity precision active filter wherein the above properties can be achieved.

According to the present invention a band-pass filter network comprises an input, an output and a plurality of circuits connected to form a ladder there-between, each said circuit comprising a positive impedance converter terminated so as to provide an impedance inversely proportional to the square of the complex frequency, said circuits being coupled by resistor networks and said input and output being resistively terminated such that all reactive circuit elements are included within the circuits.

In a preferred arrangement each adjacent pair of circuits is coupled by a single resistor.

Preferably the positive impedance converters in the first and last of said ladder of circuits are p-type positive impedance converters. In this latter arrangement the filter input comprises two terminals, one of said input terminals being connected by means of the input termination resistor to one side of the terminating capacitor in said first circuit and the other of said input terminals being connected by means of a filter common line to the other side of the terminating capacitor in said first circuit. The load resistor terminating the last of said circuits is connected in parallel with the terminating capacitor in said last circuit with one end of the said load resistor connected to the common line and the output from the filter being connected across one port of the positive impedance converter in said last circuit.

In one advantageous arrangement each positive impedance converter is a p-type positive impedance converter. Alternatively the filter can be arranged such that a p-type positive impedance converter is used in said first and last circuit and a $p^2$-type positive impedance converter is used in one or more of the other of said ladder of circuits.

In a particularly advantageous arrangement all the capacitors including those incorporated in the positive impedance converters have the same value capacitance.

Advantageously the p-type positive impedance converter comprises a pair of operational amplifier devices arranged in a circuit wherein a first terminal is connected to a second terminal by a series arrangement of a capacitor and three resistors, first inputs to the first and second amplifiers being respectively connected to the junction between said second terminal and the third resistor and to the junction between said first terminal and the capacitor, second inputs to the amplifiers being connected to the junction between the first and second resistors and the outputs from the first and second amplifiers being connected respectively to the junction between the capacitor and the first resistor and the junction between the second and third resistors. Preferably the second and third resistors are adapted to be pre-set prior to use so that each filter circuit can be tuned at the time the circuit is fabricated. Preferably also the input or source resistor and the load resistor of the band-pass filter are also adapted to be pre-set prior to use. In an advantageous embodiment the resistors are formed as thin or thick film resistors on a substrate such that the presetting of the resistors in the assemblied filter network can be done by laser trimming.

An active filter network in accordance with the present invention will now be described by reference to the accompanying drawings of which:

Figure 1:
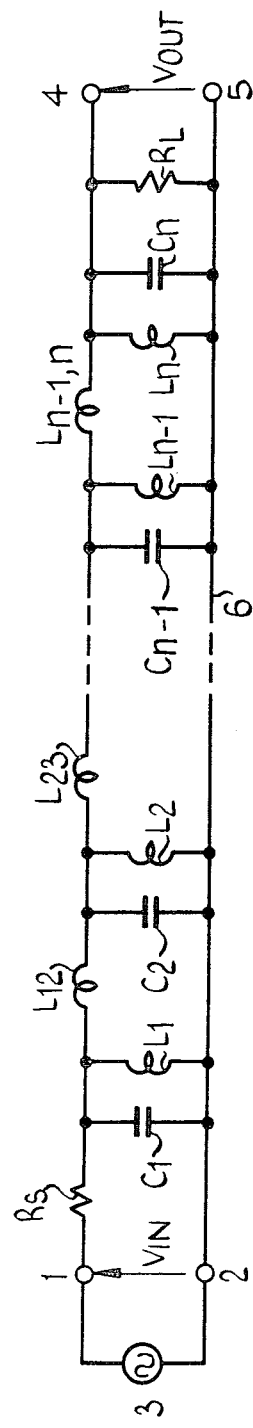
FIG. 1 shows the RLC network from which the active filter network is derived.

Referring to FIG. 1, an active filter network according to the invention is derived from the prototype LCR band-pass filter shown. The filter has input terminals 1 and 2 to which a single source 3 is connected and has output terminals 4 and 5. The prototype LCR band-pass filter is carefully designed to achieve the desired transfer function i.e. the relationship between the voltages at the output terminals 4 and 5 and the input terminals 1 and 2. The filter acts to transmit frequencies within the pass-band and to attenuate frequencies outside the limits of the pass-band. The filter input terminal 2 is connected directly to the output terminal 5 by means of a common line 6. Input terminal 1 is connected by means of a source resistor Rs to a number (n−1) of series connected inductors $L_{12}$, $L_{13}$ ... $L_{n-1,n}$, the last inductor $L_{n-1,n}$ being connected to the output terminal 4. At the junction between the source resistor Rs and $L_{12}$ there are connected in parallel paths to the common line 6 shunt capacitor $C_1$ and a shunt inductor $L_1$. In similar manner at each junction between the series inductors represented generally by the junction between $L_{j-1,j}$ and $L_{j,j+1}$ there are connected to the common line 6 a shunt capacitor $C_j$ and a shunt inductor $L_j$. Each combination of shunt capacitor $C_j$ and shunt inductor $L_j$ is considered here to form a tunable resonant circuit. Connected between the output terminals 4 and 5 is the final filter section comprising capacitor $C_n$ and inductor $L_n$ and also the terminating load resistor $R_L$.

The LCR circuit thus described can be considered as having been derived from a low-pass filter (comprising a sub-network of series-connected inductors and shunt capacitors) and a single shunt inductor acting as a high pass filter, the single inductor being connectable between the common line and a point anywhere along the line of series-connected inductors. A transformation can then be applied, without changing the transfer function apart from a possible constant multiplier, whereby the single shunt inductor is transformed to n shunt inductors to produce a band-pass filter having n tunable resonant circuits.

Figure 2:
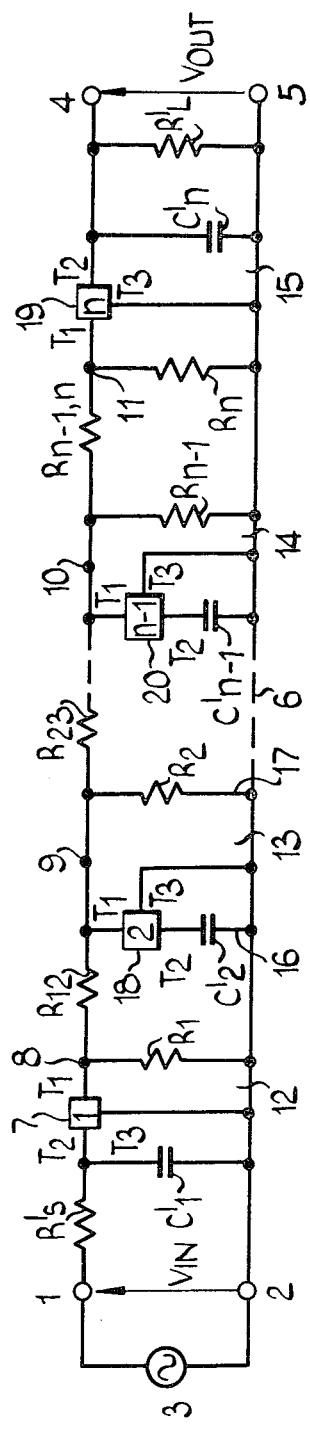
FIG. 2 shows an active filter network according to the invention.

FIG. 2 shows a circuit according to the invention which is an active simulation of the prototype circuit shown in FIG. 1. The simulation includes transformations wherein the sub-network of inductors becomes transformed to a topologically identical sub-network of corresponding resistors connected to the remainder of the network through a number of PICs of an appropriate type. The simulation method makes use of general ideas published by Gorski-Popiel in Electronics Letters, Vol 3, No 8, p 381, 1967.

In FIG. 2, like reference numerals are used to define items which are the same as in FIG. 1. The positions of the source resistors $R'_s$, load resistor $R'_L$ and the capacitors $C'_1$ to $C'_n$ are similar to those in FIG. 1. The signal source 3 is connected to the filter input terminals 1 and 2. Input terminal 2 is connected by the common line 6 to the terminal 5 of output terminals 4 and 5. The input terminal 1 is connected by the source resistor $R'_s$ to the terminal T2 of a p-type PIC 7. A capacitor $C'_1$ connects the terminal T2 of the PIC 7 to the common line 6 and a resistor $R_1$ connects the terminal T1 of the PIC 7 to the common line 6. The PIC 7, capacitor $C'_1$ and resistor $R_1$ define a first resonant circuit 12 of the bandpass filter. The terminal $T_1$ of PIC 7 is connected to connection point 8 which is the first of a series of n connection points 8, 9 ... 10, 11 interconnected by (n−1) series resistors $R_{12}$, $R_{23}$ ... $R_{n-1,n}$. Each connection point 8, 9 ... 10, 11 is connected to the common line 6 by a respective resonant circuit 12, 13 ... 14, 15. Each resonant circuit, as for example the circuit 13, comprises two parallel arms, 16 and 17, interconnecting the respective connection point 9 and the common line 6. Each arm corresponding to arm 16 comprises a p-type PIC eg 18 whose terminal $T_1$ is connected to the connection point 9 and whose terminal $T_2$ is connected to the common line 6 via a capacitor $C'_2$. Each arm corresponding to arm 17 comprises a shunt resistor eg $R_2$ connected between the appropriate connection point 9 and the common line 6. The output terminal 4 is connected to the terminal $T_2$ of PIC 19 in the final resonant circuit 15 and the load resistor $R'_L$ is connected across the two output terminals 4 and 5. The terminal $T_3$ of each PIC in the filter is connected to the common line.

In an alternative arrangement the output from the filter network can be taken from terminal $T_1$ of PIC 19 since the voltage at the two terminals $T_1$ and $T_2$ is ideally the same.

Figure 3:
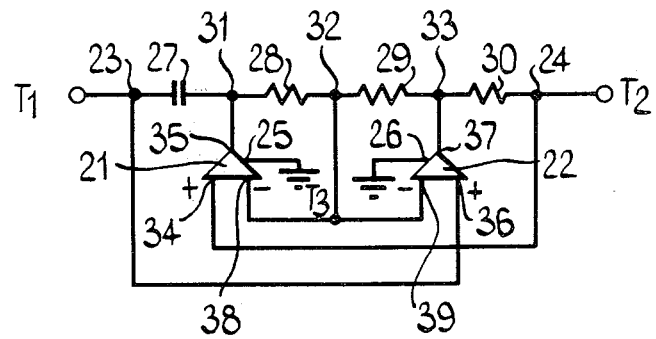
FIG. 3 shows one form of positive impedance converter circuit suitable for use in the circuit of FIG. 2.

The PICs eg 7, 18, 19 and 20 are all of the type known as p-PICs. One such p-PIC is shown in FIG. 3. The PIC comprises two operational amplifiers 21 and 22 connected in a resistor-capacitor circuit. The terminals $T_1$ and $T_2$ corresponding to the terminology previously used are indicated by connection points 23 and 24 and the terminal $T_3$ is shown by the two separate ground connections 25 and 26. Terminal $T_1$ is connected to the terminal $T_2$ by means of a capacitor 27 and three resistors 28, 29 and 30 thereby forming intermediate connection points 31, 32 and 33. The non-inverting input 34 of amplifier 21 is connected at point 24 to the output terminal $T_2$ and the output 35 of amplifier 21 is connected to point 31 between the capacitor 27 and first resistor 28. The non-inverting input 36 of the second amplifier 22 is connected at point 23 to the terminal $T_1$ and the output 37 of amplifier 22 is connected to point 33 between the second and third resistors, 29 and 30. The inverting inputs 38 and 39 of amplifiers 21 and 22 are connected to the point 32 between the first and second resistors 28 and 29.

The resistors 29 and 30 in each PIC together with the source resistor $R'_s$ and load resistor $R'_L$ are made adjustable so that the filter network can be tuned by presetting the resistors prior to use of the filter. Conveniently the adjustable resistors are formed as film resistors on a supporting substrate. By design, the capacitors, both inside the PICs and outside, are assigned the same manufacturers' preferred value capacitance. The capacitors and operational amplifiers are assembled on the substrate. Each variable resistor is made deliberately lower than its calculated value so that the resistance can be raised during tuning of the resonant circuit by removing material eg by laser trimming, diamond scribing, spark erosion or air abrasion. The resistors 28 and 29 (see FIG. 3) influence the Q of the resonant circuit including the PIC. When it is necessary to adjust the Q it has been convenient to do this by adjustment of the resistor 29. The resistor 30 is adjusted in order to adjust the resonance frequency of each resonant circuit eg 12, 13, 14 and 15.

Figure 4:
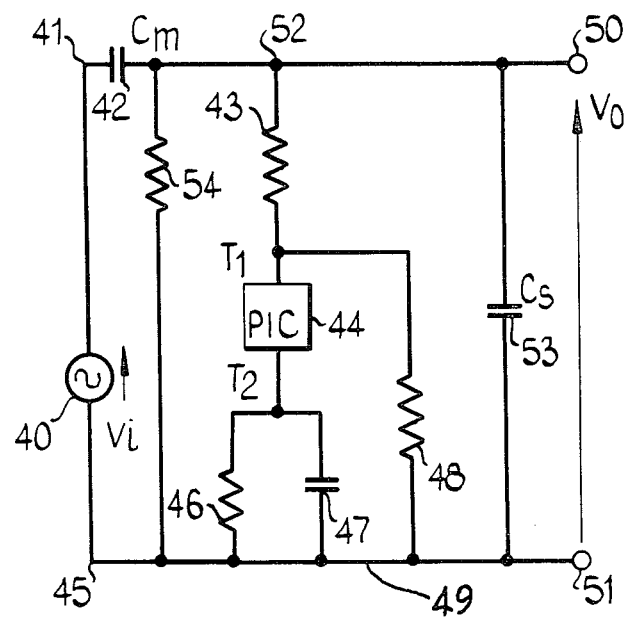
FIG. 4 illustrates an arrangement for adjusting the positive impedance converter for tuning purposes.

Each resonant circuit of the filter is assembled so as to be separately tunable in situ. Where required, each resonant circuit is first adjusted to give a high Q modulus by trimming the PIC resistors 29. The resonant circuits are then separately tuned to their design frequencies by adjusting the PIC resistors 30 and finally the terminating resistors $R'_S$ and $R'_L$ are adjusted. FIG. 4 shows a schematic circuit arrangement for tuning the individual resonant circuits of the band-pass filter. The tuning circuit arrangement comprises an input signal generator 40 connected at one terminal 41 by a capacitor 42 and a resistor 43 to the terminal $T_1$ of a PIC 44. The other terminal 45 of the generator 40 is connected by a filter terminating resistor 46 and a PIC terminating capacitor 47 in respective parallel paths to the terminal $T_2$ of the PIC 44. A resistor 48 connects the terminal $T_1$ of PIC 44 to the common line 49 which is connected to the terminal 45 of the generator 40. The circuit response is measured at the output terminals 50 and 51 connected respectively to the junction between the PIC shunt resistor 43 and the capacitor 42 and to the common line 49. The capacitor 53 shown connected across the output terminals 50 and 51 represents the input capacitance of the measuring equipment.

In the preferred tuning arrangement for tuning an intermediate resonant circuit such as 13, the resonant circuit is modified such that the PIC 44, resistors 43 and 48 and capacitor 47 shown in FIG. 4 represent the respective elements 18, $R_2$, the parallel combination of $R_{12}$ and $R_{23}$, and $C'_2$, and the resistor 46 is not present. The frequency of the input signal of the generator 40 is set to the nominal resonant frequency of the modified resonant circuit and the frequency adjusting resistor 30 (and in some cases also the Q adjusting resistor 29) within the PIC 44 is adjusted to give an attenuation greater than a specified minimum which depends on the Q factor involved. In adjusting the terminating resistors $R'_S$ and $R'_L$ the appropriate first or final filter resonant circuit (12 or 15 in FIG. 2) is adjusted as above and the appropriate terminating resistor is then added in parallel with the PIC terminating capacity as resistor 46 in FIG. 4. It can then be shown that at the resonant frequency Wr of the circuit the attenuation on connecting resistor 46 is given by the formula:

$$-20 \log_{10}\left(\frac{V_o}{V_1}\right) = 10 \log_{10}\left[\left[1 + \frac{CR}{C_m R_1 (1 + \frac{R_1}{R_2})} + \frac{C_s}{C_m}\right]^2 + \frac{1}{(W_r C_m R_1)^2}\right] dB$$

This attenuation depends on the time constant CR of capacitor 47 and resistor 46 and thus adjustment of the attenuation is equivalent to adjustment of the required time constant. A bias resistor 54, having a high resistance value, typically about 100 Kohms, is provided to ensure a dc path to the PIC.

The active filter described employs one capacitatively terminated PIC in each resonant circuit of the filter. The number of capacitors required, two for each resonant circuit, is thus equal to the order of the filter ie the minimum number possible. In addition to producing a band-pass filter requiring the minimum number of identical capacitors chosen to have a manufacturer's preferred capacitance value the filter circuit tuning method allows compansation for variation in the capacitor nominal values within a wide tolerance and compensation for imperfections of the operational amplifiers (such as finite DC gain, finite gain-bandwidth product, finite input impedance and non-zero output impedance) and some imperfections of the passive elements (such as non-zero capacitor dissipation) at certain frequencies of adjustment. In addition the effect of parasitic impedances on the response of the circuits is reduced to a minimum because the circuits can be designed so that the spread of element values is low which allows a freer choice of circuit impedance level.

In an alternative arrangement of the p-type PIC shown in FIG. 3, the capacitor 27 and the adjustable resistor 29 may be interchanged. Alternatively, the capacitatively terminated p-type PICs may be replaced by resistively terminated $p^2$-type PICs in any of the resonant circuits except the input and output resonant circuits (12 and 15 in FIG. 2). The $p^2$-type PIC is obtained by replacing the adjustable resistor 29 by a second capacitor. In this alternative embodiment there are also two capacitors in each intermediate resonant circuit of the filter, the two capacitors being located within a respective PIC. Various well-known transformations which do not change the transfer function apart from a possible constant multiplier are possible in the resistor sub-network of the filter circuit.

Figure 5A:
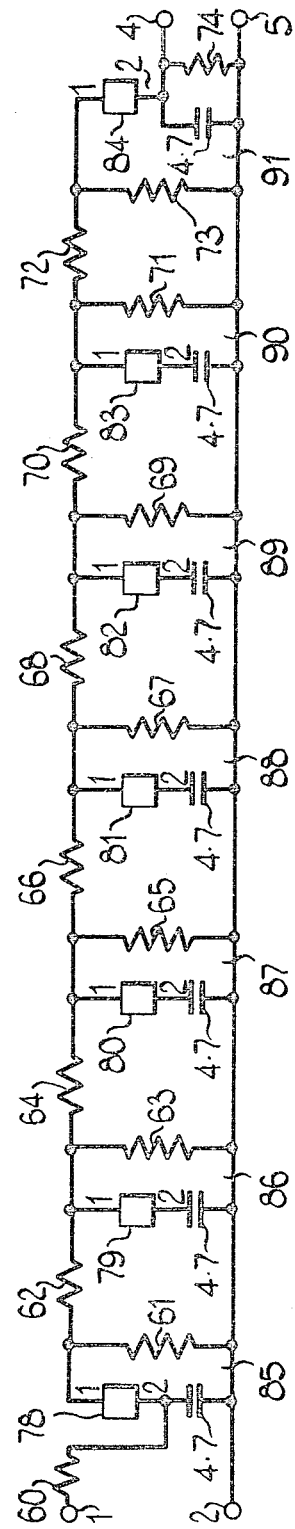
FIGS. 5A and 5B illustrate a 14th order 15–16 kHz band-pass filter according to the invention.
Figure 5B:
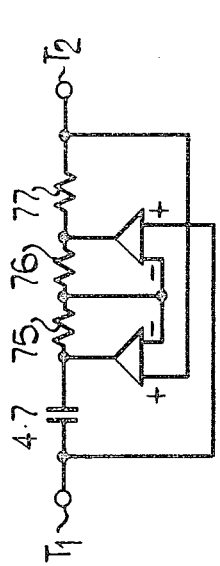

A 14th order example of the filter according to the invention is shown in FIGS. 5A and 5B where the ground leads have been omitted for clarity. This filter has been designed to have a pass-band of 15–16 kHz and to use capacitors having a nominal value of 4.7 nF.

In this example the components had the following values:

resistor 60 48,581 ohms
=
resistor 61 1,787.6 ohms
=
resistor 62 36,963 ohms
=
resistor 63 1,847.6 ohms
=
resistor 64 46,916 ohms
=
resistor 65 1,830.2 ohms
=
resistor 66 49,055 ohms
=
resistor 67 1,827.7 ohms
=
resistor 68 49,025 ohms
=
resistor 69 1,830.2 ohms.
=
resistor 70 47,016 ohms
=
resistor 71 1,847.6 ohms
=
resistor 72 36,924 ohms
=

-continued

| | |
|---|---|
| resistor 73 | 1,787.6 ohms |
| = | |
| resistor 74 | 48,785 ohms |
| = | |

In all PIC's (FIG. 5B):

| | |
|---|---|
| resistor 75 = | 2000 ohms |
| resistor 76 = | 2000 ohms |

The PIC resistors 77 (FIG. 5B) have the following values in the filter of FIG. 5A:

| In PIC | 78, | 2,791 ohms |
|---|---|---|
| | 79, | 2,811 ohms |
| | 80, | 2,804 ohms |
| | 81, | 2,803 ohms |
| | 82, | 2,803 ohms |
| | 83, | 2,809 ohms |
| | 84, | 2,802 ohms |

The seven resonant circuits 85 to 91 in this 14th order filter are tuned to the following frequencies:

| Circuit 85, | 15,161 Hz |
|---|---|
| Circuit 86, | 14,859 Hz |
| Circuit 87, | 14,948 Hz |
| Circuit 88, | 14,961 Hz |
| Circuit 89, | 14,949 Hz |
| Circuit 90, | 14,865 Hz |
| Circuit 91, | 15,129 Hz |

As can be seen, these calculated frequencies for the resonant filter circuits are all near the lower limit of the filter pass-band. It has been found that this method of tuning the individual resonant circuits sometimes leads to resonance frequencies which are not desirable as adjustment frequencies. For high frequency filters it is preferable to adjust each resonant circuit near the mid-band frequency of the filter. In these instances it is found that by using short-circuiting links to include the adjacent series resistors in parallel with the respective resonant circuit the adjustment frequency is brought nearer to the mid-band frequency of the filter.

In the 14th order 15–16 kHz filter circuit shown in FIGS. 5A and 5B, inclusion of the series resistors as described above gives the following adjustment frequencies for the resonant circuits:

| Circuit 85, | 15,525 Hz |
|---|---|
| Circuit 86, | 15,509 Hz |
| Circuit 87, | 15,508 Hz |
| Circuit 88, | 15,509 Hz |
| Circuit 89, | 15,509 Hz |
| Circuit 90, | 15,515 Hz |
| Circuit 91, | 15,491 Hz |

Figure 6:
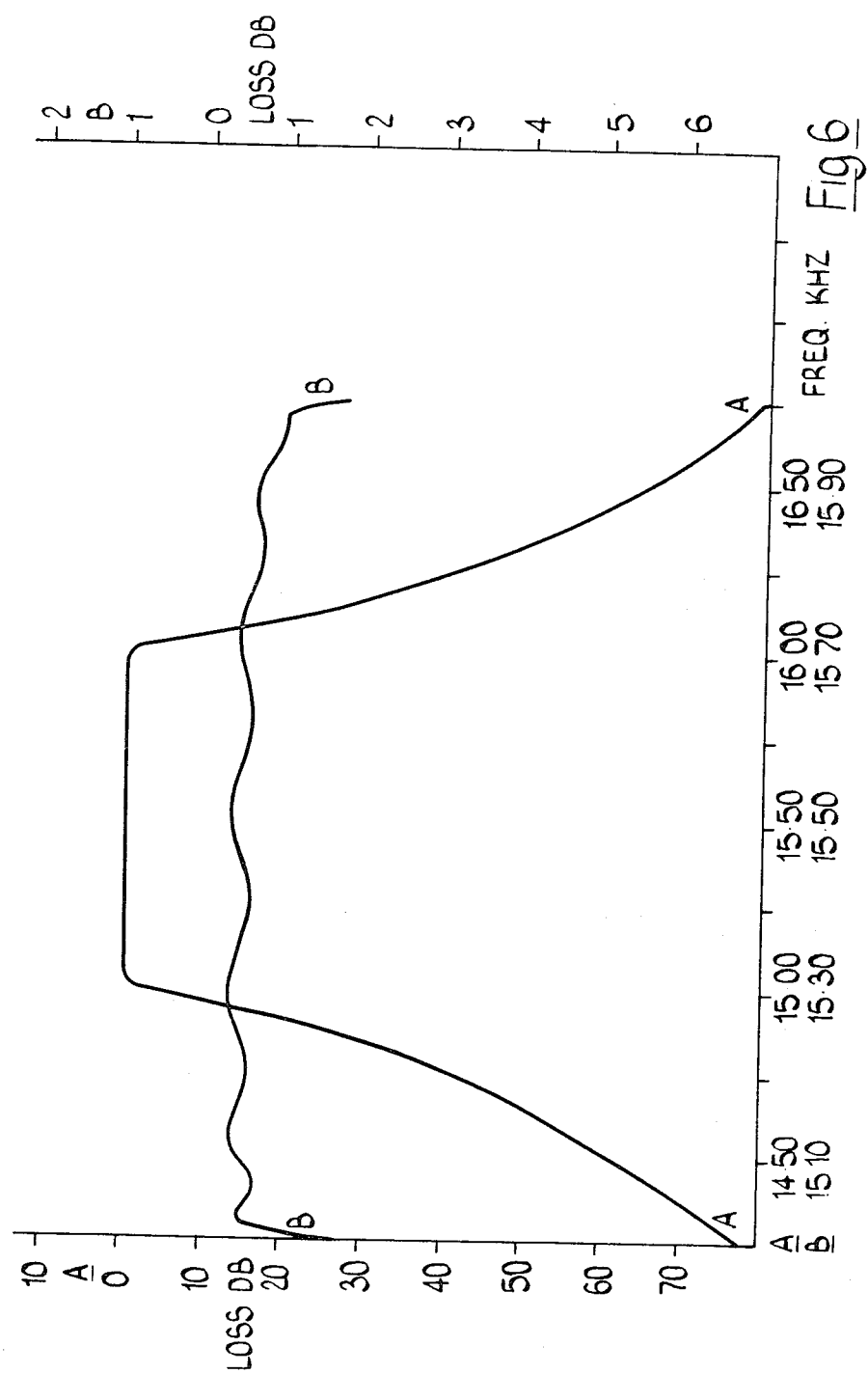
FIG. 6 illustrates the loss-frequency curve for the 14th order band-pass filter example.

The measured frequency-loss characteristic for this 14th order filter, without Q adjustment and including a 6 dB amplifier, is shown in FIG. 6.

Active filter circuits as described above can realize any even order band-pass transfer function having one zero of transmission at zero frequency and all remaining zeros of transmission at infinite frequency. Such active filters can operate up to high frequencies, because the way the PIC circuits are embedded in the filter network allows correction for high frequency imperfections. Circuits have been made with a mid-band frequency of up to 500 kHz and a mid-band frequency of 1 M Hz is thought possible.

Examples of filters according to the invention have been found to have loss-frequency responses which are much closer to arithmetic symmetry with respect to their mid-band frequencies than the responses obtained by low pass to band pass transformation. This near-arithmetic symmetry has obvious practical advantages.

Although the invention has been described with respect to two-amplifier PIC's, there are a number of known single amplifier PIC's which can be used in certain instances. The shunt branches, for example that shown in FIG. 2 including PIC 18 and capacitor $C'_2$, can be replaced by single amplifier circuits containing two capacitors.

The filter circuit shown in FIGS. 2 and 3 may require a buffer amplifier at the output terminal 4 in order to prevent loading effects. The necessity for this can be avoided in the following way. By interchanging the impedance comprising $C'_n$ and $R'_l$ in parallel with the resistor 29 in PIC 19, the output can then be taken from the output of the amplifier 22 at the point 33 in PIC 19. Apart from a scaling factor the transfer function of the modified circuit under ideal conditions is identical with that of the original circuit. In an alternative arrangement wherein the output is again taken from the point 33 in PIC 19, the parallel impedance of $C'_n$ and $R'_L$ is first interchanged with the resistor 29 as before and then the parallel impedance $C'_n$ and $R'_L$ is interchanged with the capacitor 27. As before, there is no loading effect on the transfer function. These interchanges can be done on filters of any order and result in higher gain. The new terminating resistor between the new output terminal and the common line is no longer related to $R_L$ of the prototype RLC circuit. The new filters still work between a source resistor and a terminating resistor.

We claim:

1. An active inductorless band-pass filter network which constitutes an active simulation of a low-pass filter comprising a subnetwork of series connected inductors and shunt capacitors and a single shunt inductor acting as a high pass filter, said band-pass filter network having an input, an output, and a plurality of resonant circuits connected between said input and output to form a ladder, each of said resonant circuits comprising a positive impedance converter and an associated termination impedance which coacts with said positive impedance converter so as to provide a resultant impedance in said resonant circuit which is inversely proportional to the square of the complex frequency, said resonant circuits being coupled to one another by resistor networks to form said ladder, each of said resonant circuits comprising only two capacitors and also comprising at least one resistor whose value is adapted to be adjusted prior to use of said band-pass filter network to tune the resonant circuit associated with said resistor to a particular resonant frequency, said input and output each being resistively terminated, and all capacitors of the filter being included within the said resonant circuits.

2. A band-pass filter as claimed in claim 1 wherein the positive impedance converters in the first and the last of said ladder of circuits are p-type positive impedance converters.

3. A band-pass filter according to claim 2 wherein each of said resonant circuits comprises a positive impedance converter and a series capacitor connected together in parallel with a resistor.

4. A band-pass filter according to one of claims 1, 2 or 3 wherein each capacitor of said filter has the same capacitance value.

* * * * *